United States Patent [19]

Yu et al.

[11] Patent Number: 4,628,253

[45] Date of Patent: Dec. 9, 1986

[54] CLOCK SIGNAL TEST CIRCUIT

[75] Inventors: Ruey J. Yu; William L. Martino, Jr., both of Austin, Tex.

[73] Assignee: Motorola, Inc., Schaumburg, Ill.

[21] Appl. No.: 595,194

[22] Filed: Mar. 30, 1984

[51] Int. Cl.[4] .................. G01R 15/12; G01R 31/08; H03K 5/13
[52] U.S. Cl. .............................. 324/73 R; 324/158 R; 307/269
[58] Field of Search ............... 307/454, 448, 518, 269; 324/73 R, 107, 79 D, 78 E; 371/61

[56] References Cited

U.S. PATENT DOCUMENTS 3,248,563  4/1966  Hung Chang Lin ............... 307/454

FOREIGN PATENT DOCUMENTS 0031929  3/1978  Japan ...................... 371/61

OTHER PUBLICATIONS

P. T. Brown & G. R. Heinberg, "Checking Digital System Clock Pulses, Aug. 1968, vol. 11, No. 3.

Primary Examiner—Ernest F. Karlsen
Assistant Examiner—Vinh Nguyen
Attorney, Agent, or Firm—Anthony J. Sarli, Jr.; Jeffrey Van Myers; James L. Clingan, Jr.

[57] ABSTRACT

An integrated circuit which has serially connected clock drivers for generating sequential clock signals further includes test circuitry for testing for the occurence of the clock signals. The test circuitry includes a current source for each of the sequential clock signals each of which is enabled upon receiving its associated clock signal. Consequently, the current sources are sequentially enabled until a clock signal fails to occur at which time no more clock signals occur so that no more current sources are enabled. The current sources are connected to a probe pad which is accessible external to the integrated circuit. Test apparatus for detecting the enabled current sources can be connected to the integrated circuit at the probe pad.

15 Claims, 2 Drawing Figures

CLOCK SIGNAL TEST CIRCUIT

FIELD OF THE INVENTION

This invention relates to testing clock signal generation, and more particularly, to testing clock signals which are generated sequentially.

BACKGROUND OF THE INVENTION

In many modern high density integrated circuits many different but related functions occur in response to a clock signal which is external to the integrated circuit. One example is dynamic random access memories (DRAMs) in which there are many internal functions, such as precharging various nodes and enabling various circuits, in response to an external signal. In the case of a typical DRAM there are two external clock signals used during normal operation. The various internal functions, which have a timing relation to each other, are performed in response to internal clock signals generated in response to one of the external clock signals. These internal clock signals are timed in relation to each. This timing relation is achieved by sequentially enabling clock generators. For example a first clock signal is generated by a clock generator in response to an external clock signal. The first clock signal is received by a second clock generator which in turn generates a second internal clock signal. Likewise a third internal signal is generated by a third clock generator in response to the second clock signal. Likewise other internal clock signals are generated in this sequential manner. The various functions to be performed are typically required to be performed in a predetermined sequence for the integrated circuit to function. With sequentially generated internal clock signals, the order in which these internal clock signals occurs is certain. Consequently, the sequence of the internal functions can be controlled by using these sequentially generated internal clock signals.

The problem with this technique, however, is identifying the location of a failure. If one internal clock fails to occur, then all of the subsequent ones will also fail to occur. Because it is very difficult to trace a signal on a high density integrated circuit, an internal clock failure is difficult to locate. This can be a problem in testing a design or in identifying failure modes during production. Memory cell failures are relatively easily identified when the part is functional. When an internal clock fails, however, the integrated circuit will have the appearance of not functioning at all. Consequently, the location of the cause of the failure can be extremely difficult to locate. In the design stage, the ability to locate such a failure mode is critical in correcting the design to obtain a functional design. In production the ability to identify failure modes can lead to a corrective design to enhance yields.

SUMMARY OF THE INVENTION

An object of the present invention is to provide an improved technique for detecting clock failures.

Another object of the invention is to provide an improved technique for detecting which clock in a sequential string of clocks fails.

These and other objects are achieved in a circuit which has a current source for each clock signal in a system of sequential clocks. A circuit is used to measure how much current is drained by the current drain sources to determine at what point in the system of sequential clocks that a failure, if any, occurs.

DESCRIPTION OF THE INVENTION

Figure 1:
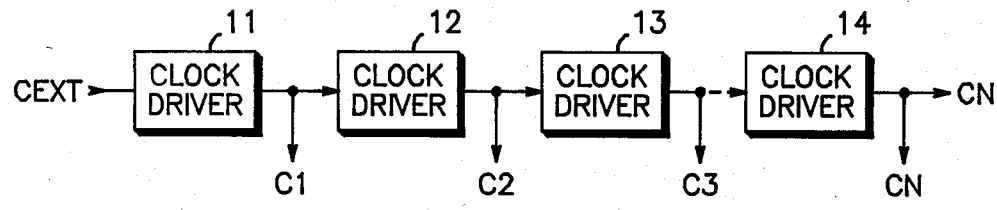
FIG. 1 is a block diagram of a sequential clock driver comprised of sequential clock generators which generate sequential clock signals.

Shown in FIG. 1 is a sequential clock driving circuit 10 comprised of clock drivers 11, 12, 13, and 14 for generating clock signals C1, C2, C3 and CN as well as other clock signals not shown. Clock driver 11 receives external clock signal CEXT and in response provides clock signal C1 to clock driver 12 which in turn provides clock signal C2 to clock driver 13 which provides clock signal C3 and so on until clock driver 14 provides clock signal CN. Each of clock drivers 11–13 are shown serially connected. Other clock drivers (not shown) are also serially connected between clock driver 13 and 14 with clock driver 14 being the last in the series. The "N" in signal CN represents the number of clock drivers in the series with each clock driver providing a clock signal so that signal CN is the last in the series. Each clock driver in the series provides the clock signal associated therewith in response to receiving a preceding clock signal. Each clock signal generated is generated some time after the preceding signal. Consequently a string of sequential clock signals is generated in which each clock signal is delayed in relation to a preceding signal. Sequential clock drivers such as sequential clock driver circuit 10 have many uses in complex integrated circuits such as dynamic RAMs and microprocessor circuits.

Figure 2:
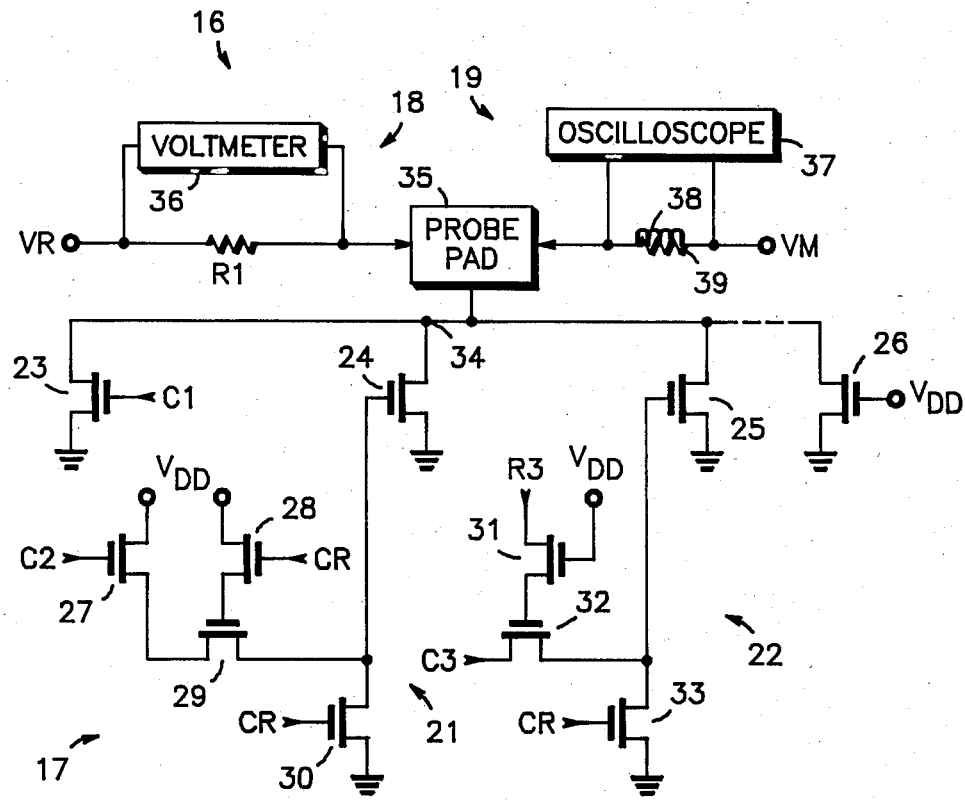
FIG. 2 is a diagram of a circuit and apparatus, according to the invention, for detecting which, if any, of the sequential clocks shown in FIG. 1 are not being supplied.

Shown in FIG. 2 is a system 16 for determining which clock signals of C1–CN of FIG. 1 fail to occur. System 16 is comprised of a test circuit 17 which is part of the same integrated circuit as that which includes clock driver circuit 10 of FIG. 1. System 16 also includes an apparatus 18 and an apparatus 19 either of which can be used to take measurements for determining the failed clock signal. Test circuit 17 is comprised of a detect and hold circuit 21, a detect and hold circuit 22, transistors 23, 24, 25, and 26, and probe pad 35. All of the transistors described herein for the embodiment shown in FIG. 2 are N channel, enhancement mode, insulated gate field effect transistors. Detect and hold circuit 21 is comprised of transistors 27, 28, 29, and 30. Detect and hold circuit 22 is comprised of transistors 31, 32, and 33. Transistor 23 has a drain connected to a node 34, a gate for receiving signal C1, and a source connected to ground. Transistor 24 has a drain connected to node 34, a gate for receiving an output from detect and hold circuit 17, and a source connected to ground. Transistor 25 has a drain connected to node 34, a gate for receiving an output from detect and hold circuit 22, and a source connected to ground. Transistor 26 has a drain connected to node 34, a gate connected to a positive power supply terminal VDD for receiving a positive power supply voltage, for example 5 volts, and a source connected to ground. Transistor 27 has a drain connected to VDD, a gate for receiving signal C2, and a source. Transistor 28 has a drain connected to VDD, a gate for receiving a reset signal CR, and a source.

Transistor 29 has a drain connected to the source of transistor 27, a gate connected to the source of transistor 28, and a source as the output of detect and hold circuit 21. Transistor 30 has a drain connected to the source of transistor 29, a gate for receiving reset signal CR, and a source connected to ground. Transistor 31 has a drain for receiving a signal R3 which has a particular relationship to signal C3, a gate connected to VDD, and a source. Transistor 32 has a drain for receiving signal C3, a gate connected to the source of transistor 31, and a source as the output of detect and hold circuit 17.

Functionally, transistors 23–26 act as current sources, each draining a fixed current from node 34 in response to being enabled. Detect and hold circuits 21 and 22 are for detecting the occurrence of clock signals C2 and C3, respectively, and, in response to detecting these clock signals enabling transistors 24 and 25. Because clock signals C2 and C3 occur sequentially, transistors 24 and 25 are enabled sequentially. Transistor 23 is shown as being enabled directly by signal C1 because for the embodiment shown in FIG. 2 signal C1 is assumed to remain present while signal CEXT is present. Each clock driver 11–14 can be designed to provide its clock signal with a particular desired duration. Clock driver 11 is assumed in the present example to provide signal C1 until signal CEXT is removed. All clock signals C1–CN in the present example are a logic high when present. Signal CEXT could be either a logic high or a logic low when present. If signal CEXT is considered present at a logic low, then clock driver would include an inverter function. Reset signal CR is a logic high for at least some period of time when signal CEXT is not present, and is a logic low when signal CEXT is present.

In order to detect current drawn by current source transistors 23–26, a probe pad 35 which is on the integrated circuit but accessible externally from the integrated circuit is connected to node 34. It is to be understood that there will be a current source transistor for each clock signal C1–CN connected to node 34. Means for measuring the current drawn by these node 34 current source transistors is external to the integrated circuit but connected thereto at probe pad 35. Apparatus 18 and apparatus 19 are two examples of how current drawn by the node 34 current source transistors could be measured. Apparatus 18 is comprised of a resistor R1, a voltmeter 36, and a voltage source VR. Apparatus 19 is comprised of an oscilloscope, a magnetic probe 38, and a voltage source VM. When connected to probe pad 35, apparatus 18 measures the current simply by measuring the voltage drop across resistor R1. Resistor R1 is connected between probe pad 35 and voltage source VR. Voltmeter 36 is connected across resistor R1 to measure the voltage drop across R1.

In operation a reset function occurs with signal CR at a logic high which causes transistors 30 and 33 to be conducting, ensuring that the gates of transistors 24 and 25 are at ground potential so that transistors 24 and 25 are ensured of being non-conducting. Transistor 28 is also conducting so that a logic high is present at the gate of transistor 29 so that transistor is conducting to ensure that the source of transistor 27 is a logic low. During reset transistor 26 is the only node 34 current source transistor that is conducting. At this time the voltage across R1 will be solely due to the current drawn by transistor 26. The voltage drop caused by transistor 26 is then the amount of voltage drop caused by the current flow of one current source transistor. As long as the current source transistors are maintained in the saturation region, the incremental current drain caused by each current source transistor will be the same as that drawn by transistor 26. This can be achieved by having transistors 23–25 each be the same size as transistor 26. Consequently, transistor 26 is used as a reference transistor for establishing a reference current, so during reset the voltage that reference current source transistor 26 develops across resistor R1 is used to establish the voltage drop that each additional current source transistor will add when it is enabled.

After reset is complete, signal CR switches to a logic low which causes transistors 28, 30, and 33 to be non-conducting. Although transistor 28 is non-conducing, a logic high will remain on the gate of transistor 29 due to the capacitance thereat. Signal CEXT then occurs causing clock C1 to occur which causes transistor 23 to be conducting, drawing more current through resistor R1. Transistor 23 draws the same amount of current as transistor 26. After signal C1 occurs, signal C2 occurs, causing transistor 27 to provide a logic high to the drain of transistor 29. The gate of transistor 29 was capacitively maintained at a logic high so that, with self-bootstrapping action, the logic high at the drain of transistor 29 is provided as the output of detect and hold circuit 29 to the gate of transistor 24 which responds by conducting. Transistor 24 also draws the same amount of current as transistors 23 and 26 so that the voltage drop across resistor R1 will again increase by the same amount as when transistor 23 was enabled. Transistor 24 will remain conducting even when signal C2 switches to a logic low. When signal C2 switches to a logic low, transistor 27 will become non-conducting, but the source will remain at a logic high by the capacitance thereat. Consequently, the gate of transistor 24 will not be pulled to a logic low by transistor 29. The logic high at the gate of transistor 24 is capacitively maintained until the next cycle when CR occurs again.

After signal C2 switches to a logic high, signal C3 switches to a logic high. Although a different circuit than circuit 21, detect and hold circuit 22 provides the same function as circuit 21. Circuit 22, for proper operation, requires that a particular signal be available which in fact may or may not be available in the integrated circuit. The particular signal is shown in FIG. 2 as signal R3. Signal R3 must switch to a logic high before signal C3 switches to a logic high and must switch to a logic low before signal C3 switches to a logic low. When signal R3 switches to a logic high, a logic high is applied to the gate of transistor 32 via transistor 31. Signal C3 then switches to a logic high which is coupled to the gate of transistor 25 by self-bootstrapping action on the gate of transistor 32. Transistor 25 thus becomes conducting so that another increment of current, equal to that drawn by transistors 23, 24, and 26, is drawn by transistor 25 through resistor R1, causing another incremental voltage drop equal to that caused by transistors 23, 24, and 26. In order to ensure that the gate of transistor 25 is held at a logic high for sufficiently long, for example several microseconds, transistor 32 must be non-conducting before signal C3 switches to a logic low. This is achieved by signal R3 switching to a logic low before signal C3 switches to a logic low. Signal R3 switching to a logic low pulls the gate of transistor 31 to a logic low. This takes advantage of the bilateral nature of such transistors, that source and drain functions are interchangeable. Consequently, when signal C3 switches to a logic low, transistor 32 is non-conducting so that the logic high at the gate of transistor 25 is unaffected and is capacitively maintained at a logic high.

The process of each clock in the sequential series enabling a current source continues until the last clock signal, signal CN occurs unless there is a clock signal failure. If a clock signal fails to occur, then no subsequent clock signals will occur either due to the serial connection of the clock drivers. Consequently, the point in the series of clock drivers at which the clock driver failed is easily detected by apparatus 18. The number of current sources which were enabled, including the reference current source, transistor 26, is determined by dividing the total voltage drop across resistor R1 by the reference voltage. This number should be very close to a whole number which will equal the number of good clock signals plus one, (the reference current source). Consequently, this whole number will be the same as that of the failed clock signal.

Essentially the same technique as that described for using apparatus 18 is used for apparatus 19 in detecting a failed clock signal. Apparatus 19 uses a voltage source VM connected to probe pad 27 by a wire 39 around which magnetic probe 38 is coupled. Magnetic probe 38 is connected to oscilloscope to display current flowing through wire 39. Transistors 23-25 are sequentially enabled in the same way as previously described. In this case transistor 26 is not required because the incremental currents contributed by transistors 23-25 and other current sources not shown can be observed with respect to time on oscilloscope 37. Because each incremental current is seen as a step on oscilloscope 37, it is also not as critical that each current source draw the same amount of current. An added benefit of using apparatus 19 is that some information, which can be useful in design or even in production, on the timing of clock signals C1-CN can be obtained on oscilloscope 37 even if all of clock signals C1-CN occur. The point in the string of serial clock drivers at which a failure occurs is easily obtained from observing oscilloscope 37. When one of clock signals C1-CN fails to occur, no more current contributions will be made, and the current steps will stop. The number of steps which occurred can be counted as observed on oscilloscope 37. This number would be the number of good clock signals. The next clock signal in the sequence would be the one which failed.

This technique of detecting sequential clock failues has been described in an N channel embodiment but is equally applicable to P channel. For example, using P channel transistors for current sources would probably result in providing current to instead of drawing current from node 34. Either way the technique is current sources passing current between an internal power supply terminal, ground in FIG. 2, and a current node, node 34 in FIG. 2. The current which is passed by the current sources is also passed between probe pad 35 and an external power supply terminal, either VR or VM in FIG. 2, where the current can be measured conveniently. Also, if low threshold transistors are available in the particular process for making the integrated circuit, they can be used to advantage for transistors 27, 28, and 31 to reduce the amount of voltage drop in signal coupling.

While the invention has been described in a preferred embodiment, it will be apparent to those skilled in the art that the disclosed invention may be modified in numerous ways and assume many embodiments other than that specifically set out and described above. Accordingly, it is intended by the appended claims to cover all modifications of the invention which fall within the true spirit and scope of the invention.

We claim:

1. An integrated circuit for being tested by a test apparatus which is external to the integrated circuit, comprising:
   serially connected first, second, and third clock drivers for sequentially providing, first, second, and third clock signals, respectively;
   first current source means for passing current between a current node and a first power supply terminal in response to receiving the first clock signal;
   second current source means for passing current between the current node and the first power supply terminal in response to receiving the second clock signal;
   third current source means for passing current between the current node and the first power supply terminal in response to receiving the third clock signal; and
   a probe pad coupled to the current node for providing a connecting point to the integrated circuit for the test apparatus which is external to the integrated circuit.

2. The integrated circuit of claim 1 further comprising a first detect and hold circuit having an input for receiving the second clock signal and an output coupled to the second current source means for coupling the second clock signal to the second current source.

3. The integrated circuit of claim 2 wherein the second current source means is a first transistor having a control electrode coupled to the first detect and hold circuit, a first current electrode coupled to the current node, and a second current electrode coupled to the first power supply terminal.

4. The integrated circuit of claim 3 wherein the first clock driver provides the first clock signal in response to receiving a signal which is external to the integrated circuit.

5. The integrated circuit of claim 4 wherein the first detect and hold circuit comprises:
   a second transistor having a control electrode for receiving the second clock signal, a first current electrode coupled to a second power supply terminal, and a second current electrode;
   a third transistor having a first current electrode coupled to the second current electrode of the second transistor, a second current electrode coupled to the control electrode of the first transistor, and a control electrode; and
   a fourth transistor having a first current electrode coupled to the second power supply terminal, a second current electrode coupled to the control electrode of the third transistor, and a control electrode for receiving a reset signal, wherein the reset signal occurs when the external signal is not present.

6. The integrated circuit of claim 5 further comprising a fifth transistor having a first current electrode coupled to the control electrode of the first transistor, a control electrode for receiving the reset signal, and a second current electrode coupled to the first power supply terminal.

7. The integrated circuit of claim 3 wherein the detect and hold circuit comprises;
   a second transistor having a first current electrode for receiving the second clock signal, a second current electrode coupled to the control electrode of the first transistor, and a control electrode; and
   a third transistor having a first current electrode coupled to the control electrode of the second transistor, a control electrode coupled to a second power supply terminal, and a second current electrode for receiving an enable signal;
   wherein the enable signal occurs before the first clock signal occurs and is removed before the first clock signal is removed.

8. The integrated circuit of claim 7 wherein, the first, second and third clock signals occur in response to a signal which is external to the integrated circuit.

9. The integrated circuit of claim 8 further comprising a fourth transistor having a first current electrode coupled to the control electrode of the first transistor, a second current electrode coupled to the first power supply terminal, and a control electrode for receiving a reset signal, wherein the reset signal occurs when the external signal is not present.

10. The integrated circuit of claim 1 wherein the first current source means is a first transistor having a first current electrode coupled to the current node, a second current electrode coupled to the first power supply terminal, and a control electrode for receiving the first clock signal.

11. The integrated circuit of claim 10 further comprising reference current source means for passing a reference current between the current node and the first power supply terminal.

12. In an integrated circuit having serially connected first, second, and third clock drivers for sequentially providing first, second, and third clock signals, respectively, a method for testing the occurrence of the first, second, and third clock signals comprising the steps of:
   providing first, second, and third current source means associated with the first, second and third clock signals, respectively, each for passing current between a first power supply terminal and a current node in response to the occurrence of the clock signal with which it is associated;
   providing a probe pad on the integrated circuit which is coupled to the current node and which can be electrically coupled to circuitry which is external to the integrated circuit;
   passing all of the current, which is passed by the first, second, and third current sources between the current node and the first power supply terminal, between the probe pad and an external current supply, said external current supply being external to the integrated circuit; and
   measuring the current which passes between the external current supply and the probe pad.

13. The method of claim 12 wherein measuring the current is achieved with a magnetic probe and an oscilloscope.

14. The method of claim 12, further comprising the steps of:
   providing a reference current source means for passing a reference current between the first power supply terminal and the current node; and
   passing all of the current passed by the reference current source means between the probe pad and the external power supply.

15. The method of claim 14 wherein measuring the current is achieved by interposing a resistor between the probe pad and the external current supply and measuring a voltage drop thereacross.

* * * * *